US011597808B2

(12) United States Patent
Tan et al.

(10) Patent No.: US 11,597,808 B2
(45) Date of Patent: Mar. 7, 2023

(54) METHOD FOR PREPARING MODIFIED POLYPROPYLENE FILM

(71) Applicant: Guangdong Technion Israel Institute of Technology, Shantou (CN)

(72) Inventors: Daniel Qi Tan, Shantou (CN); Guanghui Song, Shantou (CN); Xudong Wu, Shantou (CN)

(73) Assignee: Guangdong Technion Israel Institute of Technology

( * ) Notice: Subject to any disclaimer, the term of this patent is extended or adjusted under 35 U.S.C. 154(b) by 0 days.

(21) Appl. No.: 17/038,210

(22) Filed: Sep. 30, 2020

(65) Prior Publication Data

US 2022/0064396 A1 Mar. 3, 2022

(30) Foreign Application Priority Data

Sep. 3, 2020 (CN) .......................... 202010913566.9

(51) Int. Cl.
| | |
|---|---|
| *C23C 16/34* | (2006.01) |
| *C08J 7/06* | (2006.01) |
| *C23C 14/06* | (2006.01) |
| *C23C 14/08* | (2006.01) |
| *C23C 16/40* | (2006.01) |
| *C23C 16/455* | (2006.01) |
| *H01G 4/14* | (2006.01) |
| *H01G 4/33* | (2006.01) |

(52) U.S. Cl.
CPC .............. *C08J 7/06* (2013.01); *C23C 14/0641* (2013.01); *C23C 14/08* (2013.01); *C23C 16/34* (2013.01); *C23C 16/40* (2013.01); *C23C 16/45525* (2013.01); *C23C 16/45553* (2013.01); *C23C 16/45555* (2013.01); *H01G 4/145* (2013.01); *H01G 4/33* (2013.01); *C08J 2323/12* (2013.01)

(58) Field of Classification Search
CPC ....... C23C 16/34; C23C 16/40; C23C 16/345; C23C 16/401; C23C 16/402; C23C 16/403; C23C 16/50; C23C 14/0641; C23C 14/08; C23C 14/0652; C23C 14/081
See application file for complete search history.

(56) References Cited

U.S. PATENT DOCUMENTS

| | | | | |
|---|---|---|---|---|
| 6,656,602 | B1* | 12/2003 | Ishikawa | .................. C08J 7/046 428/522 |
| 9,279,120 | B2* | 3/2016 | Liang | ..................... A61L 27/306 |
| 2003/0185982 | A1* | 10/2003 | Schwarzenbach | ......................... H01J 37/32532 427/255.28 |
| 2004/0194691 | A1* | 10/2004 | George | ............... C23C 16/0272 117/84 |
| 2010/0246094 | A1* | 9/2010 | Tan | ...................... C23C 14/5826 361/323 |
| 2013/0109042 | A1* | 5/2013 | Ellson | ................... B01L 3/0268 435/23 |
| 2014/0162132 | A1* | 6/2014 | Ishii | .................. C23C 16/45555 427/78 |
| 2015/0266904 | A1* | 9/2015 | Yoshino | .................. C23C 16/06 427/250 |
| 2016/0045934 | A1 | 2/2016 | Hoffmann | |
| 2016/0085090 | A1* | 3/2016 | Harding | ................. G02B 1/041 351/159.6 |
| 2016/0300900 | A1* | 10/2016 | Miyake | ................ G09G 3/3233 |
| 2016/0329392 | A1* | 11/2016 | Miyake | ................ G09G 3/3258 |
| 2016/0351443 | A1* | 12/2016 | George | .................... B01J 23/38 |
| 2017/0025658 | A1* | 1/2017 | Shi | ....................... H01M 50/431 |
| 2017/0178816 | A1* | 6/2017 | Shiraki | .................. H01G 4/015 |
| 2018/0037017 | A1* | 2/2018 | Sato | ..................... B32B 27/281 |
| 2018/0223429 | A1* | 8/2018 | Fukazawa | ......... C23C 16/45553 |

FOREIGN PATENT DOCUMENTS

| | | | | |
|---|---|---|---|---|
| CN | 101844643 | * | 1/2012 | ............. B65D 65/40 |
| GB | 2514539 | A | 3/2014 | |
| JP | 2006-57121 | * | 3/2006 | ........... C23C 16/462 |
| JP | 2018-157055 | A | 10/2018 | |
| JP | 2019-520277 | A | 7/2019 | |
| JP | 2019-135325 | A | 8/2019 | |

(Continued)

OTHER PUBLICATIONS

Lahtinen, Kimmo, et al., "UV protective zinc oxide coating for biaxially oriented polypropylene packaging film by atomic layer deposition". Thin Solid Films 570 (2014) 33-37.*
Kim, Patrick Joo Hyun, et al., "Surface Functionalization of a Conventional Polypropylene Separator with an Aluminum Nitride Layer toward Ultrastable and High-Rate Lithium Metal Anodes". ACS Appl. Mater. Interfaces, 2019, 11, 3917-3924.*
Nguyen, Hoang-Linh, et al., "Sustainable Boron Nitride Nanosheet-Reinforced Cellulose Nanofiber Composite Film with Oxygen Barrier without the Cost of Color and Cytotoxicity". Polymers, 2018, 10, 501, pp. 1-11. doi:10.3390/polym10050501.*
Kou, R., et al., "Spectrometric analysis of silicon nitride films deposited by low-temperature liquid-source CVD". J. Appl. Phys. 126, 133101 (2019) pp. 1-7. doi: 10.1063/1.5114675.*

(Continued)

*Primary Examiner* — Bret P Chen
(74) *Attorney, Agent, or Firm* — Dorf & Nelson LLP; Scott D. Locke, Esq.

(57) ABSTRACT

A method for preparing a modified polypropylene film, the modified polypropylene film comprising a polypropylene film; and, an oxide layer and/or nitride layer, each of which has a thickness of 20-500 nm, on a surface of the polypropylene film; the method comprising: depositing the oxide layer or nitride layer on a surface of the polypropylene film by an Atomic Layer Deposition (ALD) process to obtain the modified polypropylene film; wherein the step of depositing the oxide layer or nitride layer comprises: placing the polypropylene film in an ALD reaction chamber; vacuumizing; heating up; introducing a carrier gas; and, passing at least two precursors into the reaction chamber alternately for reaction, resulting in the modified polypropylene film; wherein the precursors comprise a precursor for providing a metal element or Si, and a precursor for providing an oxygen or nitrogen element.

3 Claims, 5 Drawing Sheets

(56) References Cited

FOREIGN PATENT DOCUMENTS

JP          2020-004743 A      1/2020
WO      WO2017-221781 A1    12/2017

OTHER PUBLICATIONS

Song, Guanghui, et al., "Atomic Layer Deposition for Polypropylene Film Engineering—A Review". Macromolecular Materials and Engineering, vol. 305, Issue 6, 2000127, pp. 1-24.*

Li, Chengwu, "Modification and characterization of polypropylene". Journal of Chemical and Pharmaceutical Research, 2014, 6(7): 1467-1473.*

Hyde, G. Kevin, et al., "Atomic Layer Deposition and Abrupt Wetting Transitions on Nonwoven Polypropylene and Woven Cotton Fabrics". Langmuir 2010, 26(4), 2550-2558.*

Xintai brochure, "Modifed Polypropylene Film". 10 pages. Date and citation information unavailable.*

Jia, Xiaojuan, et al., "Atomic layer deposition of Al2O3 on porous polypropylene hollow fibers for enhanced membrane performance." Chinese Journal of Chemical Engineering 26 (2018) 695-700.*

Song, Guanghui, et al., "Atomic Layer Deposition for Polypropylene Film Engineering—A Review". Macromol. Mater. Eng.2020, 305 , 2000127, pp. 1-24.*

Men, Xin, et al., "Atomic Layer Deposition of Silicon Nitride Thin Films: A Review of Recent Progress, Challenges, and Outlooks". Materials, 2016, 9, 1007, pp. 1-20.*

Kurimsky, J., et al., "Breakdown Voltage of Polypropylene Film During DC and Thermal Ageing". 2017 18th International Scientific Conference on Electric Power Engineering (EPE), 2017, pp. 1-4.*

Wu, Xudong, et al., "High-temperature resistant polypropylene films enhanced by atomic layer deposition". Nano Express 2 (2021) 010025, pp. 1-8.*

Kim, Kyungjin, et al., "Environmentally Assisted Cracking in Silicon Nitride Barrier Films on Poly(ethylene terephthalate) Substrates". Applied Materials & Interfaces, 2016, 8, 27169-27178.*

Xie, Zilong, et al., "One-step alkyl-modification on boron nitride nanosheets for polypropylene nanocomposites with enhanced thermal conductivity and ultra-low dielectric loss". Composites Science and Technology 208 (2021) 108756, pp. 1-10.*

European Patent Office, European Search Report, dated Mar. 15, 2021, Application No. EP 20199355, The Hague, NL.

Chung, T.C., Synthesis of functional polyolefin copolymers with graft and block structures, Prog Polym Sci. 27 (2002) 39-85.

Japanese Intellectual Property Office, Notice of Reason for Rejection, Japanese Patent Application 2020-170584, dated Mar. 12, 2014.

* cited by examiner

METHOD FOR PREPARING MODIFIED POLYPROPYLENE FILM

CROSS-REFERENCE TO RELATED APPLICATIONS

This application is based upon and claims priority to Chinese Patent Application No. 2020109135669, filed on Sep. 3, 2020, the entire contents of which are incorporated herein by reference.

TECHNICAL FIELD

The invention belongs to the field of film materials, and particularly relates to a high-temperature resistant modified polypropylene film, and a preparation method and use thereof

BACKGROUND

Polypropylene (PP) is a cheap polymer material with widespread applications. In addition to use in water purification, medical-sanitary products and battery diaphragms, compact PP films also play an important role in food industry, packaging, high-voltage insulation, energy-storage capacitors, and the like. At present, PP has become one of the most important polymers in building a modern world. Many functionalized and composite-type PP materials can be physically and chemically modified, and then be beneficial to, such as, industrial and commercial applications as engineering plastics. Film capacitors are particularly dependent on PP films. Because such capacitors have very high power density, extremely high charge-discharge rate, an ultra-long service life, self-healing capability and stability, they are extremely important in advanced technical fields such as the fields of new energy, high-speed railway transportation, high-voltage transmission, electric vehicles, petroleum exploration, aerospace and electromagnetic weapons. The PP films can become biaxially-oriented polypropylene (BOPP) films through biaxial stretching. BOPP films show high withstand-voltage performance (breakdown strength) and mechanical strength, and are rare film materials of choice for capacitor technology. However, at present, the modified film materials are limited by a low maximum working temperature (90-105° C.). In particular, the modified film materials have great dimensional changes and lower withstand voltage capability at high temperature. In view of this, such materials cannot meet the requirements of many applications which need high temperature. It is necessary to make further innovations in the organic film and capacitor industries, to improve the performance of the organic films and improve related technical solutions.

PP is a soft and flexible material with a relatively low melting point between 160 and 175° C. Although the mechanical strength can be enhanced by filling inorganic powder or fibers to make a composite material, the flexibility and withstand-voltage insulating properties would be lost at the same time. Such composite material can no longer be made into an ultra-thin film for the preparation of high-performance capacitors. Some scholars tried to increase the dielectric constant or capacitance of PP by changing the functional groups at the ends of its molecular chain, which, however, resulted in greatly increased dielectric loss and the cost and process difficulty of the film preparation. Biaxially stretching to improve the crystallinity and orientation of the PP film is a traditionally accepted method for improving the dielectric withstand-voltage strength, by which the dielectric withstand-voltage strength has been increased up to 60-70%. However, there is very limited space for continuing to improve the dielectric withstand-voltage strength through this method. Currently, some film manufacturing companies in Europe and Japan are trying to appropriately increase the working temperature of PP by further improving the crystallinity thereof and the industrial control of the crystallization. But it has not been successful so far, and no products have been put into the market. At the same time, the companies producing polypropylene raw materials are trying to improve the performance of the materials by adding additives and reducing impurity contents, but the attempt is still in the research stage.

In the last 10 years, great efforts have been made to improve the production processes of BOPP films around the world, and to further reduce the thickness of the films (now reduced to 2 microns). While the ultra-thin BOPP films face the problems of surface roughness and defects, as well as of non-uniformity in thickness. In conclusion, the dimensional instability and the inability to withstand high breakdown voltage at high temperatures are the main shortcomings of the polypropylene films.

Therefore, it is desirable to provide a high-temperature resistant modified polypropylene film and a preparation method thereof.

SUMMARY

The present disclosure is intended to solve at least one of the aforementioned technical problems in the prior art. For this, the present disclosure provides a high-temperature resistant modified polypropylene film and a preparation method thereof. The modified polypropylene film of the present disclosure has high-temperature resistance (for example, resistance to a high temperature above 150° C.), extremely small deformation at high temperature and good mechanical properties, and can withstand a high breakdown voltage at high temperature.

Therefore, a first aspect of the disclosure provides a high-temperature resistant modified polypropylene film.

Particularly, the high-temperature resistant modified polypropylene film includes: a polypropylene film; and, an oxide layer and/or nitride layer, each of which has a thickness of 20-500 nm, on a surface of the polypropylene film Preferably, the oxide layer or nitride layer may have a thickness of 30-300 nm; and further preferably, the oxide layer or nitride layer may have a thickness of 40-200 nm.

Preferably, the oxide layer may be composed of at least one selected from an aluminum oxide, a titanium oxide, a zinc oxide, a silicon oxide, a zirconium oxide, a tantalum oxide, a niobium oxide, a magnesium oxide, a calcium oxide, an iron oxide, strontium titanate and barium titanate.

Further preferably, the oxide layer may be composed of at least one selected from $Al_2O_3$, $TiO_{2-x}$, $TiO_2$, $Ti_2O_3$, ZnO, $SiO_2$, $ZrO_2$, $Ta_2O_5$, $Nb_2O_5$, MgO, $Fe_2O_3$, $SrTiO_3$ and $BaTiO_3$, wherein $0<x<1$.

Preferably, the nitride layer may be composed of at least one selected from an aluminum nitride, a titanium nitride, a boron nitride, a silicon nitride and a tantalum nitride.

Further preferably, the nitride layer may be composed of at least one selected from AlN, TiN, BN, $Si_3N_4$ and TaN.

Preferably, the polypropylene film may have a thickness of 0.5-50 μm; and further preferably, the polypropylene film may have a thickness of 1-20 μm.

Preferably, the oxide layer and/or nitride layer may be provided on one or both sides of the polypropylene film.

A second aspect of the disclosure provides a method for preparing the aforementioned high-temperature resistant modified polypropylene film.

Particularly, the above method for preparing the aforementioned high-temperature resistant modified polypropylene film includes:

depositing the oxide layer or nitride layer on the surface of the polypropylene film by an Atomic Layer Deposition (ALD), Physical Vapor Deposition (PVD), Plasma-Enhanced Chemical Vapor Deposition (PECVD) or electron beam evaporation (e-beam) process to obtain the modified polypropylene film.

Preferably, the oxide layer or nitride layer may be deposited on the surface of the polypropylene film by the ALD process, to obtain the modified polypropylene film. The high-temperature resistance of the modified polypropylene film prepared by the ALD process is superior to that of the modified polypropylene film prepared by the PVD, PECVD or e-beam process.

Preferably, the step of depositing the oxide layer or nitride layer on the surface of the polypropylene film by the ALD process to obtain the modified polypropylene film may specifically comprise:

placing the polypropylene film into an ALD reaction chamber; vacuumizing; heating up; introducing a carrier gas; and, passing at least two precursors into the reaction chamber alternately for reaction, resulting in the modified polypropylene film;

wherein the precursors include a precursor for providing a metal element or Si, and a precursor for providing an oxygen or nitrogen element.

Preferably, the metal element may be at least one selected from Al, Ti, Zn, Zr, Ta, Nb, Mg, Fe, Sr and Ba.

Preferably, the vacuumizing may achieve a vacuum degree of 250 mTorr or less.

Preferably, the heating may achieve a temperature no more than 100° C.; and preferably, the heating may achieve a temperature of 60-100° C. (this temperature can not only avoid the deformation of the polypropylene film, but also facilitate the reaction to generate the oxide layer or nitride layer). The ALD reaction chamber may be kept at a temperature no more than 100° C. for 3-6 minutes before introducing the two precursors.

Preferably, the carrier gas may be an inert gas; and further preferably, the carrier gas may be argon.

Preferably, the flow rate of the carrier gas may be kept constant throughout the ALD process, and may be 5-15 sccm and preferably be 8-10 sccm.

Preferably, the duration of a pulse of each precursor may be 21-200 msec each time; and, after each pulse of the precursor, the inert gas may make sweep for 3-6 seconds.

Preferably, in order to ensure that the polypropylene film keeps flat after entering the deposition chamber, it is necessary to remove static electricity on the surface of the polypropylene film by means of an ionizer before depositing the oxide layer or nitride layer. The used ionizer may be Tronovo model-TR7045, which needs to blow each polypropylene film of 200 cm$^2$ for 3-5 seconds at room temperature, and the distance between the polypropylene film and the air outlet is 25-30 cm.

Particularly, in the ALD reaction chamber, the gaseous precursor molecules for providing the metal element or Si are first brought towards the polypropylene film by argon flow at the beginning of the reaction, and are retained on the surface of the polypropylene film due to adsorption. Then, the remaining precursor molecules for providing the metal element or Si are swept away by argon. Next, the gaseous precursor molecules for providing the oxygen or nitrogen element are brought to the surface of the polypropylene film by the argon flow, to react with the precursor molecules for providing the metal element or Si that have been retained on the surface, to generate a solid oxide or nitride and gaseous by-products. Then, the remaining precursor molecules for providing the oxygen or nitrogen element and the gaseous by-products are swept away by the argon flow, resulting in the end of the first cycle of the ALD process. In the following second cycle of ALD, the precursor molecules for providing the metal element or Si and the precursor molecules for providing the oxygen or nitrogen element are alternately and sequentially brought to the surface of the polypropylene film by the argon flow, to react with the other precursor molecules that have been retained on the surface of the polypropylene film due to reaction or adsorption. With the generation of the gaseous by-products, a metal or Si layer and an oxygen or nitrogen layer are alternately deposited on the surface of the polypropylene film layer by layer. The two precursors are alternately introduced into the ALD reaction chamber. That is, each precursor is introduced in a form of pulses. Between the two precursor pulses of certain durations, it is necessary to sweep away the by-products and residual reactants by introducing the inert gas for a period of time. The thickness of the deposited oxide layer or nitride layer is generally proportional to the total number of ALD cycles (i.e., total duration), closely related to the kinetic characteristics of the temperature dependent reactions of ALD, and also has a certain relationship with the durations of the precursor pulses and of the inert gas sweeping.

The method of depositing the oxide layer or nitride layer on the surface of the polypropylene film by the aforementioned ALD process to obtain the modified polypropylene film, is also suitable for preparing modified thermoplastic films.

Preferably, the modified thermoplastic film may include any one selected from a modified polyvinyl chloride film, a modified polystyrene film, a modified polyester film, a modified polycarbonate film, a modified polyethylene naphthalate film or a modified polyvinylidene fluoride film. The properties of the resulted modified thermoplastic film are similar to those of the modified polypropylene film.

A third aspect of the disclosure provides use of the aforementioned high-temperature resistant modified polypropylene film.

Provided is the use of the aforementioned high-temperature resistant modified polypropylene film in an electronic product.

Provided is an electronic product comprising the aforementioned high-temperature resistant modified polypropylene film.

Preferably, the electronic product is a capacitor.

The inventor surprisingly found that depositing the oxide layer or nitride layer of an appropriate thickness on the surface of the polypropylene film by the ALD process can significantly improve the thermal stability of the polypropylene film, and even more surprisingly found that the modified polypropylene film prepared by the method of the disclosure has good high-temperature withstand-voltage property.

Compared to the prior art, the present disclosure has the following beneficial effects.

(1) The modified polypropylene film of the disclosure has high-temperature resistance (for example, resistance to high temperature above 150° C.), extremely small deformation at high temperature and good mechanical properties, and can withstand a high breakdown voltage at high temperature (for example, the modified polypropylene film can withstand a voltage of 580 kV/mm at 140° C.).

(2) The modified polypropylene film prepared by the disclosure has widespread applications in the field of electronic products, such as capacitors, which have high temperature requirements.

DETAILED DESCRIPTION

Figure 1:
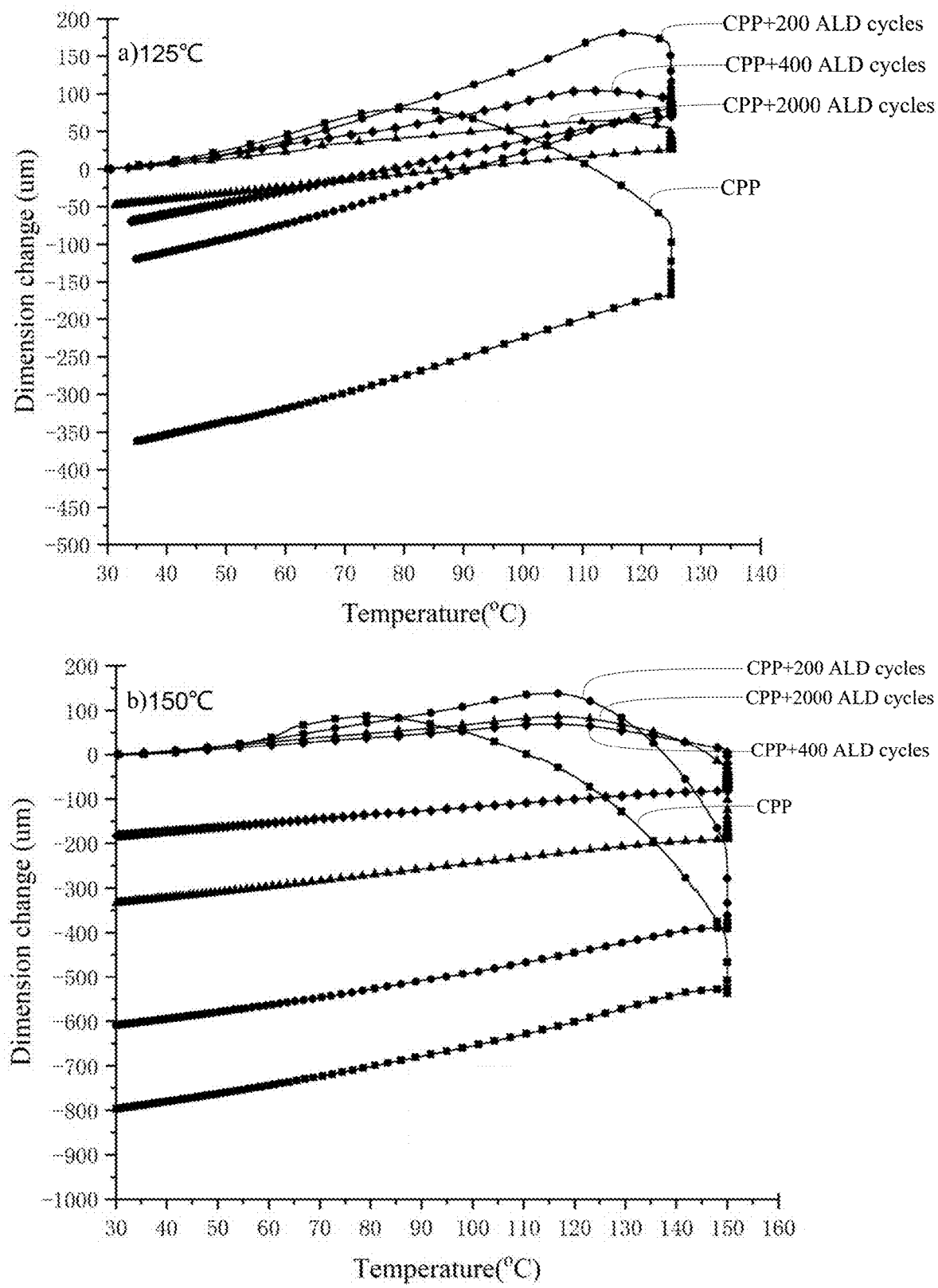
FIG. 1 is a graph showing the dimensional changes of the modified polypropylene film prepared in Example 1 as a function of temperature.

The following examples are provided only for illustration purpose in order to enable those skilled in the art to understand the technical solution of the present disclosure more clearly. It should be noted that the following examples are not intended to limit the claimed scope of the present disclosure.

Unless otherwise specified, the raw materials, reagents or devices used in the following examples can be obtained through conventional commercial approaches or by existing known methods.

Hereafter, the modified polypropylene films were prepared by using a thermal ALD device GEMSTAR TX. In the following examples, the used domestic-made polypropylene CPP films are polypropylene films purchased in China, and the imported polypropylene HCPP films are polypropylene films with high crystallinity purchased from other countries.

Example 1: Preparation of High-Temperature Resistant Modified Polypropylene Films The high-temperature resistant modified polypropylene film included a domestic-made polypropylene CPP film and an $Al_2O_3$ layer on the surface of the domestic-made polypropylene CPP film, where the $Al_2O_3$ layer had a thickness of 20-200 nm.

The method for preparing the aforementioned high-temperature resistant modified polypropylene film included the following steps:

Place a polypropylene film in an ALD reaction chamber; vacuumize to 250 mTorr; heat until reaching a temperature of 90° C.; introduce argon at a flow rate of 10 sccm; introduce trimethyl aluminum (TMA) and water ($H_2O$) precursors alternately into the reaction chamber for reaction, and perform ALD cycles in which each ALD cycle consisted of TMA pulsing for 21 msec, argon sweeping for 6 sec, $H_2O$ pulsing for 21 msec and argon sweeping for 6 sec, then resulting in the modified polypropylene films.

By the preparation method of this example, the modified polypropylene films were prepared through 200 (i.e., performing 200 ALD cycles), 400 (i.e., performing 400 ALD cycles) and 2000 (i.e., performing 2000 ALD cycles) ALD cycles, respectively. The $Al_2O_3$ layer became thicker as the number of deposition cycles increased.

Example 2: Preparation of High-Temperature Resistant Modified Polypropylene Films The difference between Example 2 and Example 1 only lied in that the domestic-made polypropylene CPP film was replaced by the imported polypropylene HCPP film. The rest of the preparation method was the same as that of Example 1.

By the preparation method of this example, the modified polypropylene films were prepared through 400, 800 and 2000 ALD cycles, respectively. The resulted $Al_2O_3$ layer became thicker as the number of deposition cycles increased.

Example 3: Preparation of High-Temperature Resistant Modified Polypropylene Films The high-temperature resistant modified polypropylene film included a domestic-made polypropylene CPP film and a $TiO_2$ layer on the surface of the domestic-made polypropylene CPP film, wherein the $TiO_2$ layer had a thickness of 20-200 nm.

The method for preparing the aforementioned high-temperature resistant modified polypropylene film included the following steps:

Place the polypropylene film in an ALD reaction chamber; vacuumize to 250 mTorr; heat until reaching a temperature of 100° C.; introduce argon at a flow rate of 10 sccm; introduce titanium isopropylate (TIP) and water ($H_2O$) precursors alternately into the reaction chamber for reaction; perform 800 ALD cycles in which each ALD cycle consisted of TIP pulsing for 200 msec, argon sweeping for 6 sec, $H_2O$ pulsing for 200 msec and argon sweeping for 6 sec, then resulting in the modified polypropylene films.

Example 4: Preparation of High-Temperature Resistant Modified Polypropylene Films The high-temperature resistant modified polypropylene film included a domestic-made polypropylene CPP film and a ZnO layer on the surface of the domestic-made polypropylene CPP film, wherein the ZnO layer had a thickness of 20-200 nm.

The method for preparing the aforementioned high-temperature resistant modified polypropylene film included the following steps:

Place the polypropylene film in an ALD reaction chamber; vacuumize to 250 mTorr; heat until reaching a temperature of 90° C.; introduce argon at a flow rate of 10 sccm and introduce diethyl zinc (DEZ) and water ($H_2O$) precursors alternately into the reaction chamber; perform 800 ALD cycles in which each ALD cycle consisted of DEZ pulsing for 200 msec, argon sweeping for 6 sec, $H_2O$ pulsing for 200 msec and argon sweeping for 6 sec, then resulting in the modified polypropylene film.

Example 5: Preparation of High-Temperature Resistant Modified Polypropylene Films The high-temperature resistant modified polypropylene film included a domestic-made polypropylene CPP film and an AlN layer on the surface of the domestic-made polypropylene CPP film, wherein the AlN layer had a thickness of 20-200 nm.

The method for preparing the aforementioned high-temperature resistant modified polypropylene film included the following steps:

Place the polypropylene film in an ALD reaction chamber; vacuumize to 250 mTorr; heat until reaching a temperature of 100° C.; introduce argon at a flow rate of 10 sccm; introduce trimethyl aluminum (TMA), triethylamine and water ($H_2O$) precursors alternately into the reaction chamber for reaction; perform 800 ALD cycles in which each ALD cycle consisted of TMA pulsing for 200 msec, argon sweeping for 6 sec, $H_2O$ pulsing for 200 msec and argon sweeping for 6 sec, then resulting in the modified polypropylene film.

Tests for the Performance of the Products
1. Performance Test of Modified Polypropylene Film Prepared in Example 1
   1.1. Test for Dimensional Changes as a Function of Temperature The modified polypropylene films (with an initial length of 16 mm) prepared by the method, in which 200, 400 and 2000 ALD cycles were performed respectively, of Example 1, and an unmodified CPP film (with an initial length of 16 mm) were taken and tested for the dimensional changes thereof along a stretching direction as the temperature changed. The results were shown in FIG. 1.

FIG. 1 is a graph showing the dimensional changes of the modified polypropylene films prepared in Example 1 as a function of temperature. In FIG. 1, a) indicates that, during the testing process, the samples to be tested were kept at 125° C. for half an hour; and b) indicates that, during the testing process, the samples to be tested were kept at 150° C. for half an hour. As shown in FIG. 1, the CPP curve shows the relationship between the dimensional changes of the unmodified polypropylene film and the temperature, and the CPP+200 ALD cycles, CPP+400 ALD cycles and CPP+2000 ALD cycles curves show the relationship between the dimensional changes of the modified polypropylene films prepared in Example 1 and the temperature. It can be seen from the CPP curve that the unmodified CPP film has shrunk at 100° C., and has a shrinkage rate up to 3% at 150° C. In contrast, the shrinkage rates of the modified polypropylene film are far below 3% at 150° C.

1.2. Test for the Storage Modulus Changes as a Function of Temperature

Figure 2:
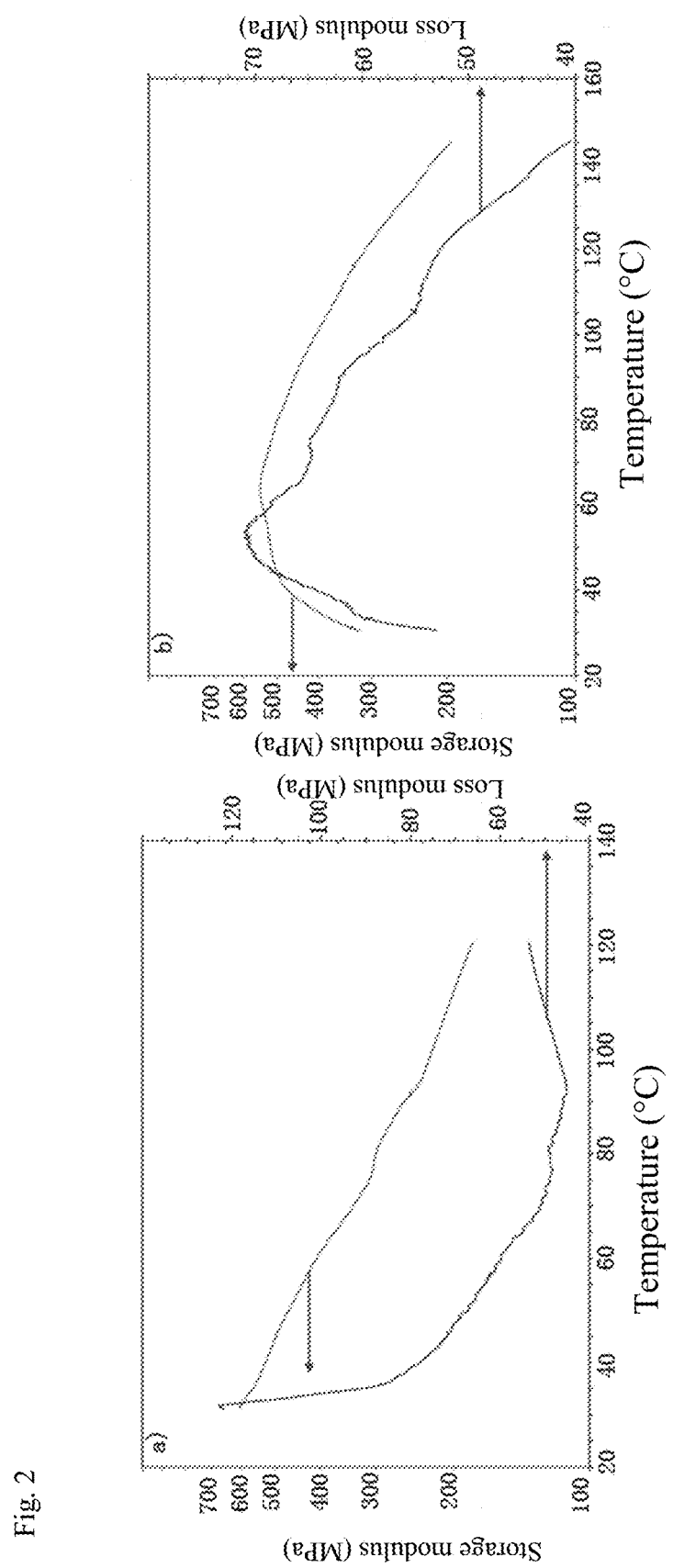
FIG. 2 is a graph showing the changes of storage modulus of the modified polypropylene film prepared in Example 1 as a function of temperature.

The modified polypropylene film prepared by the method, in which 2000 ALD cycles were performed, of Example 1 and the unmodified CPP were taken and tested for the changes of storage modulus and loss modulus as the temperature changed. The results are shown in FIG. 2. FIG. 2 is a graph showing the changes of storage modulus of the modified polypropylene film prepared in Example 1 as a function of temperature. In FIG. 2, a) shows the relationship between the changes of storage modulus and loss modulus of the unmodified CPP film and the temperature; and b) shows the relationship between the changes of storage modulus and loss modulus of the modified polypropylene film prepared by the method with 2000 ALD cycles of Example 1. It can be seen from FIG. 2 that the storage modulus of the unmodified CPP decreases rapidly with the increase of the temperature. In contrast, the storage modulus of the modified polypropylene film prepared by the method with 2000 ALD cycles of Example 1 is still 200 MPa at high temperature such as 150° C.

Figure 3:
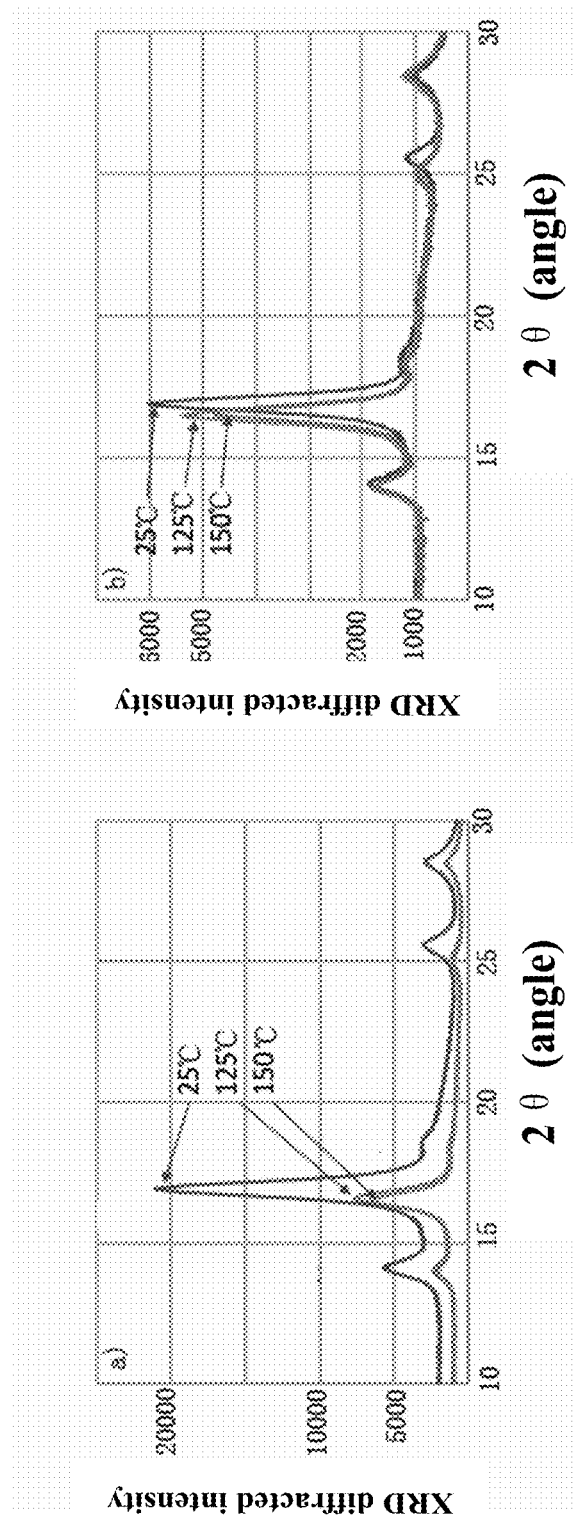
FIG. 3 is a graph showing the changes of X-ray diffraction (XRD) spectrum of the modified polypropylene film prepared in Example 1 as a function of temperature.

1.3. Test for Changes of XRD Spectrum (X-Ray Diffraction Spectrum) as a Function of Temperature The modified polypropylene film prepared by the method with 2000 ALD cycles of Example 1 and the unmodified CPP were taken and tested for the changes of XRD spectrum (X-ray diffraction spectrum) as a function of temperature. The results are shown in FIG. 3. FIG. 3 is a graph showing the changes of XRD spectrum of the modified polypropylene film prepared in Example 1 as a function of temperature. In FIG. 3, a) shows the changes of XRD spectrum of the unmodified CPP as a function of temperature, and b) shows the changes of XRD spectrum of the modified polypropylene film prepared by the method with 2000 ALD cycles of Example 1 as a function of temperature. It can be seen from FIG. 3 that the unmodified CPP film loses its crystal orientation at high temperature, while the modified polypropylene film prepared by the method with 2000 ALD cycles of Example 1 substantially does not lose its crystal orientation at high temperature.

Figure 4:
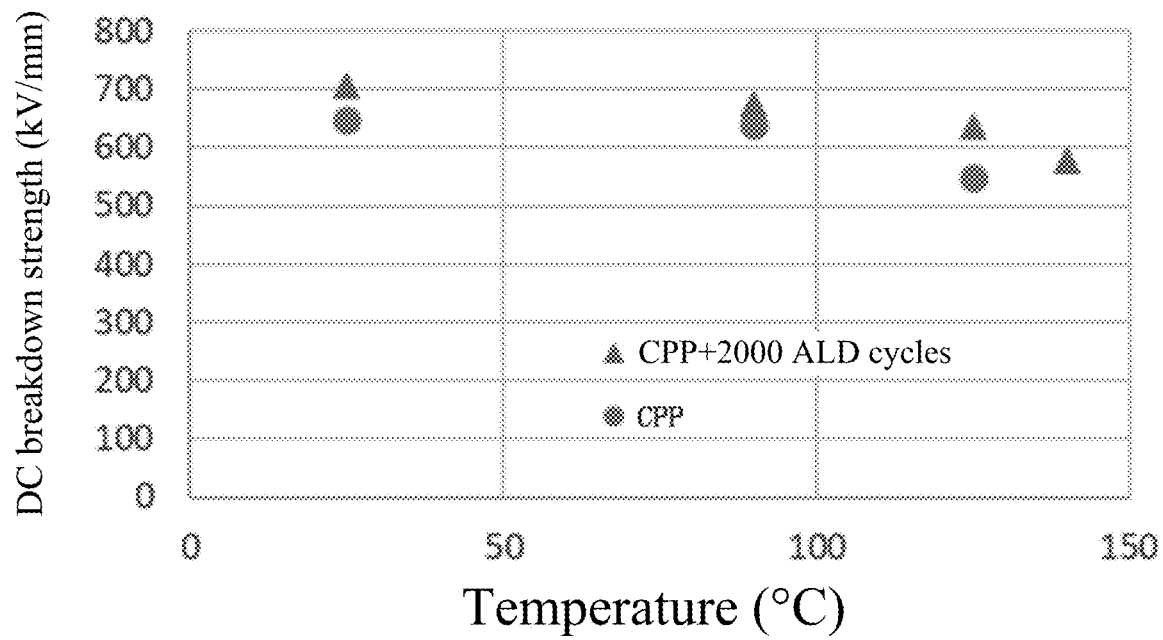
FIG. 4 is a graph showing the changes of direct voltage (DC) voltage breakdown strength of the modified polypropylene film prepared in Example 1 as a function of temperature.

1.4. Test for Changes of DC Voltage Breakdown Strength as Function of Temperature The modified polypropylene film prepared by the method with 2000 ALD cycles of Example 1 and the unmodified CPP were taken and tested for the changes of DC voltage breakdown strength as a function of temperature. The results are shown in FIG. 4. In FIG. 4, the CPP shows the changes of DC voltage breakdown strength of the unmodified CPP as a function of temperature, and the CPP+2000 ALD cycles shows the changes of DC voltage breakdown strength of the modified polypropylene film prepared by the method with 2000 ALD cycles of Example 1 as a function of temperature. It can be seen from FIG. 4 that the DC voltage breakdown strength of the unmodified CPP is obviously reduced at high temperature, while the DC voltage breakdown strength of the modified polypropylene film prepared by the method with 2000 ALD cycles of Example 1 has no obvious reduction at high temperature (140° C.).

2. Performance Test of Modified Polypropylene Film Prepared in Example 2

Figure 5:
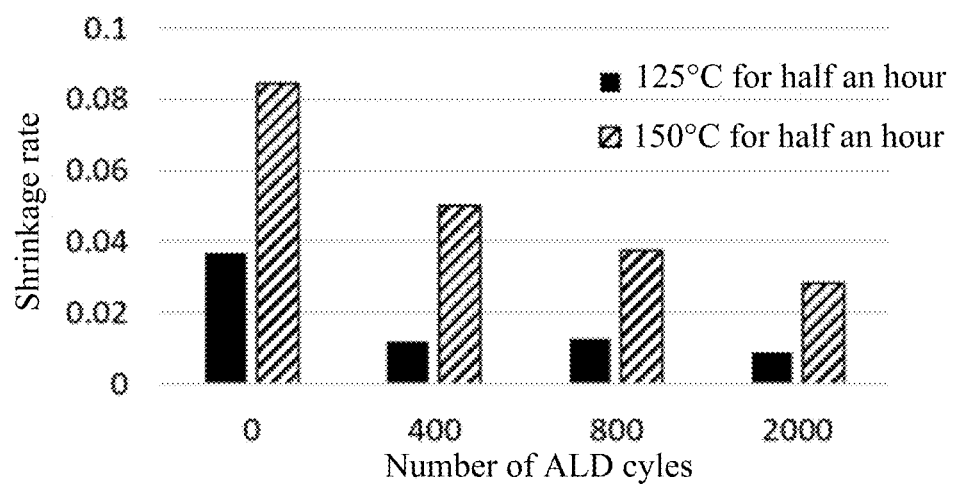
FIG. 5 is a graph showing the changes of the shrinkage rates of the modified polypropylene film prepared in Example 2 as a function of temperature.

The modified polypropylene films prepared by the method, in which 400, 800 and 2000 ALD cycles were performed, of Example 2 and the unmodified HCPP film (i.e., 0 cycle of ALD deposition) were taken and tested for the shrinkage rates along the stretching direction as a function of temperature. The results are shown in FIG. 5. FIG. 5 is a graph showing the changes of the shrinkage rates of the modified polypropylene films prepared in Example 2 as a function of temperature (the phrase "125° C. for half an hour" means that the sample to be tested was kept at 125° C. for half an hour, and the phrase "150° C. for half an hour" means that the sample to be tested was kept at 150° C. for half an hour). It can be seen from FIG. 5 that the shrinkage rates of the unmodified HCPP have reached above 3% at 125° C., while the shrinkage of each of the modified polypropylene films prepared in Example 2 is less than 3% after being kept at 125° C. for half an hour.

3. Performance Test of Modified Polypropylene Film Prepared in Example 3

Figure 6:
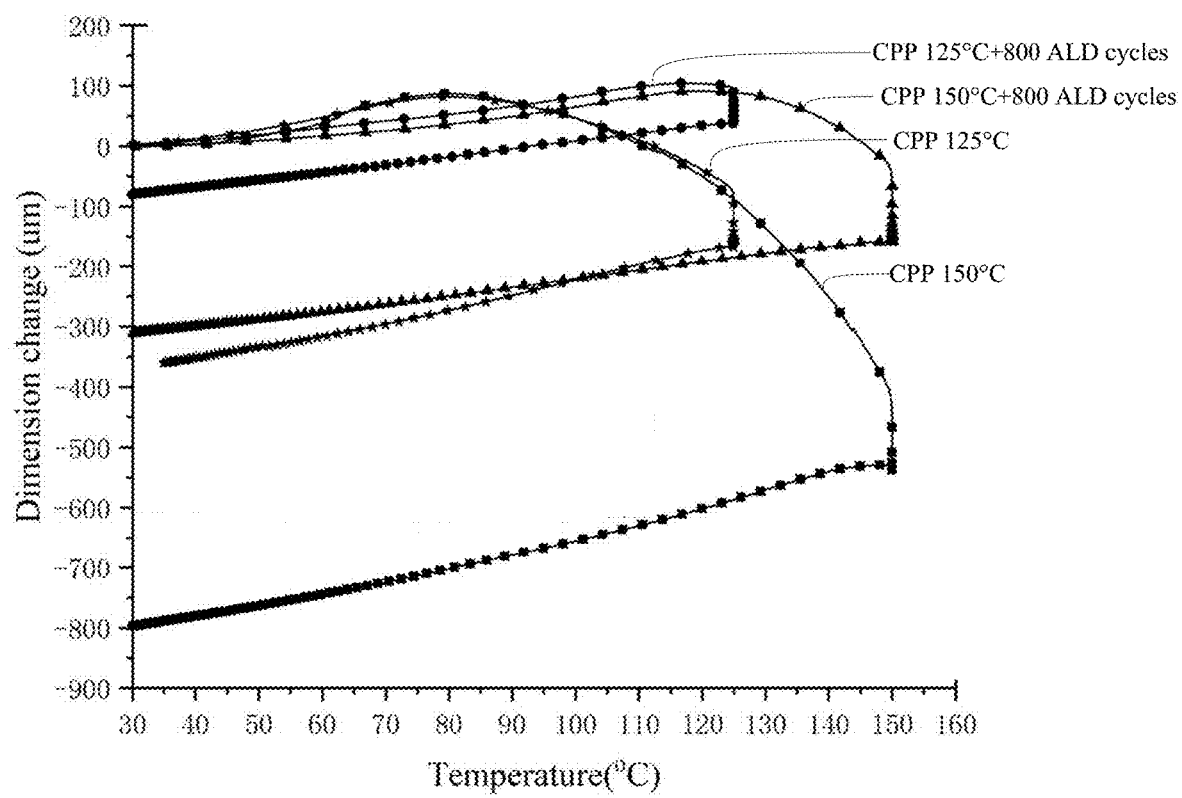
FIG. 6 is a graph showing the dimensional changes of the modified polypropylene film prepared in Example 3 as a function of temperature.

The modified polypropylene film prepared by the method, in which 800 ALD cycles were performed, of Example 3 and the unmodified CPP were taken and tested for the dimensional changes along the stretching direction as a function of temperature. The results are shown in FIG. 6. FIG. 6 is a graph showing the dimensional changes of the modified polypropylene film prepared in Example 3 as a function of temperature. In FIG. 6, the "CPP 125° C." curve indicates the dimensional changes of the unmodified CPP along the stretching direction as a function of temperature after being kept at 125° C. for half an hour; and the "CPP 150° C." curve indicates the dimensional changes of the unmodified CPP along the stretching direction as a function of temperature after being kept at 150° C. for half an hour; the "CPP 125° C.+800 ALD cycles" curve indicates the dimensional changes of the modified polypropylene film prepared by the method with 800 ALD cycles of Example 3 along the stretching direction as a function of temperature after being kept at 125° C. for half an hour; and the "CPP 150° C.+800 ALD cycles" curve indicates the dimensional changes of the modified polypropylene film prepared by the method with 800 ALD cycles of Example 3 along the stretching direction as a function of temperature after being kept at 150° C. for half an hour.

It can be seen from FIG. 6 that the dimensional changes of the modified polypropylene film prepared by the method with 800 ALD cycles of Example 3 are significantly less than those of the unmodified CPP. The shrinkage rates of the modified polypropylene films prepared by the method with 800 ALD cycles of Example 3 are less than 2%.

4. Performance Test of Modified Polypropylene Films Prepared by the Methods with 800 ALD Cycles of Examples 1, 3, 4 and 5

The modified polypropylene films prepared by the methods, in which 800 ALD cycles were performed, of Examples 1, 3, 4 and 5 respectively, and the unmodified CPP film were taken and kept at 150° C. for half an hour. Then, these films were tested for the shrinkage rates thereof along the stretching direction. The results are shown in FIG. 7.

Figure 7:
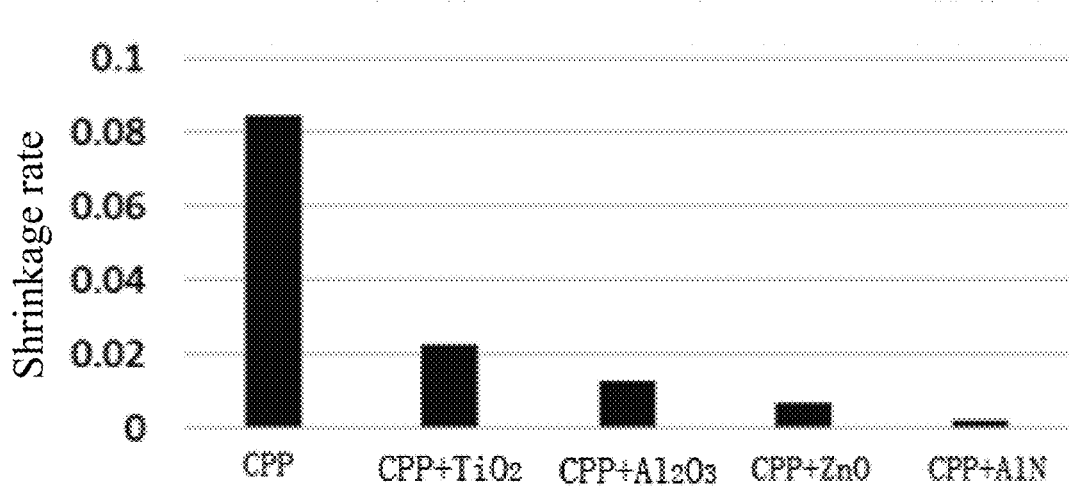
FIG. 7 is a graph showing the shrinkage rates of the modified polypropylene films prepared by 800 ALD cycles in Examples 1, 3, 4 and 5 after being kept at 150° C. for half an hour.

FIG. 7 is a graph showing the shrinkage rates of the modified polypropylene films prepared by the methods with 800 ALD cycles of Examples 1, 3, 4 and 5 after being kept at 150° C. for half an hour. In FIG. 7, CPP represents the unmodified CPP; CPP+TiO$_2$ represents the modified polypropylene film prepared in Example 3; CPP+Al$_2$O$_3$ represents the modified polypropylene film prepared in Example 1; CPP+ZnO represents the modified polypropylene film prepared in Example 4; and CPP+AlN represents the modified polypropylene film prepared in Example 5.

It can be seen from FIG. 7 that the shrinkage rate of each of the modified polypropylene films prepared by the method with 800 ALD cycles of Examples 1, 3, 4 and 5 is significantly less than that of the unmodified CPP.

What is claimed is:

1. A method for preparing a modified polypropylene film, the modified polypropylene film comprising a polypropylene film; and, a nitride layer that has a thickness of 20-500 nm, on a surface of the polypropylene film;
    the method comprising:
    depositing the nitride layer on a surface of the polypropylene film by an Atomic Layer Deposition (ALD) process to obtain the modified polypropylene film;
    wherein the step of depositing the nitride layer on a surface of the polypropylene film, comprises: placing the polypropylene film in an ALD reaction chamber; vacuumizing; heating up; introducing a carrier gas; and, passing at least two precursors into the reaction chamber alternately for reaction, resulting in the modified polypropylene film;
    wherein the precursors comprise a precursor for providing a metal element or Si or B, and a precursor for providing a nitrogen element;
    wherein the modified polypropylene film has a withstanding voltage of 580 kV/mm at 140° C.

2. The method according to claim 1, wherein the metal element is at least one selected from Al, Ti, Zn, Zr, Ta, Nb, Mg, Fe, Sr and Ba;
    wherein, the vacuumizing achieves a vacuum degree of 250 mTorr or less;
    wherein, the precursors performs the reaction at a temperature no more than 100° C.

3. The method according to claim 1, wherein the nitride layer is composed of at least one selected from an aluminum nitride, a titanium nitride, a boron nitride, a silicon nitride and a tantalum nitride.

* * * * *